(12) United States Patent
Kim

(10) Patent No.: US 7,148,137 B2
(45) Date of Patent: Dec. 12, 2006

(54) METHOD OF FORMING METAL LINE IN SEMICONDUCTOR DEVICE

(75) Inventor: Jung Ho Kim, Yecheon-gun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/008,152

(22) Filed: Dec. 10, 2004

(65) Prior Publication Data
US 2005/0130399 A1  Jun. 16, 2005

(30) Foreign Application Priority Data
Dec. 10, 2003  (KR) ...................... 10-2003-0089431

(51) Int. Cl.
H01L 21/4763 (2006.01)
(52) U.S. Cl. .................. 438/625; 438/622; 438/692
(58) Field of Classification Search ............... 438/597, 438/622, 625–629, 631, 633–634, 637, 642–645, 438/648, 652–654, 656, 666, 669, 671–672, 438/675, 685, 687–688, 692, 700, 702, 720, 438/742
See application file for complete search history.

(56) References Cited
U.S. PATENT DOCUMENTS
5,874,358 A * 2/1999 Myers et al. ............... 438/640
6,133,142 A * 10/2000 Tran et al. .................. 438/625
6,274,475 B1 * 8/2001 Shields ....................... 438/622
6,274,499 B1 * 8/2001 Gupta et al. ................ 438/692
6,350,665 B1 * 2/2002 Jin et al. ..................... 438/585
6,376,325 B1 * 4/2002 Koo ............................ 438/396

* cited by examiner

Primary Examiner—Michael Lebentritt
Assistant Examiner—Andre' Stevenson
(74) Attorney, Agent, or Firm—Oblon, Spivak, McClelland, Maier & Neustadt, P.C.

(57) ABSTRACT

A method of forming a metal line in a semiconductor device. The method includes forming an insulating interlayer over a substrate provided with a lower metal line, and forming a hole exposing the lower metal line. The method also includes forming a first metal layer on the insulating interlayer including an inside of the hole and the lower metal line, forming a conductor layer on the first metal layer to fill the hole, and etching back the conductor layer to form a plug until the first metal layer is exposed. The method further includes stacking a second metal layer and a third metal layer on the first metal layer, and patterning the second metal layer, the third metal layer, and the first metal layer to form an upper metal line overlapped with the plug using an etch mask defining the upper metal line.

6 Claims, 4 Drawing Sheets

METHOD OF FORMING METAL LINE IN SEMICONDUCTOR DEVICE

BACKGROUND OF THE INVENTION

1. Field of the Invention

The present invention relates to a method of fabricating a semiconductor device, and more particularly, to a method of forming a metal line in a semiconductor device.

2. Discussion of the Related Art

Generally, a process of forming a metal contact is essential to fabricating a multi-layer semiconductor device. The metal contact may form a base of a vertical line between upper and lower conductor layers. Meanwhile, as the space for the contact is reduced according to the high integration of semiconductor devices, an aspect ratio of a contact hole increases. Hence, the metal contact forming process becomes more difficult and important.

Despite its poor property of filing up a contact hole, aluminum, which has low specific resistance and can be easily provided, is one of the most popular contact materials. Yet, as the space for the contact is abruptly reduced, it is no longer feasible to fill the contact hole with only aluminum anymore.

Hence, a metal line forming process using a tungsten plug, which has a very good property with respect to filling gaps, despite its specific resistance relatively higher than that of Al, together with an Al line has become popular.

FIGS. 1A to 1F are cross-sectional diagrams of a process of forming a metal line according to a related art, in which a general tungsten plug forming process is applied to forming the metal line.

Referring to FIG. 1A, a metal line 102 is formed on a semiconductor substrate 100 provided with various devices therein. An insulating interlayer 104 is formed over the substrate including the metal line 102 and is then made smooth. A prescribed portion of the insulating interlayer 104 is selectively etched to form a contact or via hole 106 exposing part of the metal line 102.

Referring to FIG. 1B, a first metal layer 108 is formed on the insulating inter layer 104 including an inside of the contact or via hole 106. In this case, the first metal layer 108 is formed of a liner barrier metal such as Ti/TiN.

Referring to FIG. 1C, a tungsten layer 110 is deposited on the first metal layer 108 so that the contact or via hole 106 can be filled up with the tungsten layer 110.

Referring to FIG. 1D, the tungsten layer 110 is etched back to form a tungsten plug 110. After the contact or via hole 106 has been filled up with the tungsten layer 110, CMP (chemical mechanical polishing) is carried out on the tungsten layer 110 and the first metal layer 108. A touch-up process is then carried out on the substrate 100 to remove tungsten residue remaining on the insulating interlayer 104, whereby the tungsten plug 108 filing up the contact or via hole is completed.

Referring to FIG. 1E, a second metal layer 112, a metal layer 114, and a third metal layer 116 are sequentially deposited over the substrate 100 including the tungsten plug. Photoresist is coated on the third metal layer. Exposure and development is carried out on the photoresist to form a photoresist pattern 118 defining a metal line over the tungsten plug. Specifically, the second and third metal layers 112 and 116 are preferably formed of Ti/TiN. The metal layer 114 as a main line material may be formed of aluminum.

Referring to FIG. 1F, dry etch is carried out over the substrate including the third metal layer 116, the metal layer 114, and the second metal layer 112 using the photoresist pattern 118 in FIG. 1E as an etch mask. Hence, a metal line consisting of the second metal layer 112, the metal layer 114, and the third metal layer 116 is completed. Thereafter, the photoresist pattern is removed.

However, in the related art method of forming the metal line, the touch-up process for forming the tungsten plug after CMP for insulating layer smoothing scratches a surface of the insulating interlayer 104 or rips out the insulating interlayer 104 provided with the contact or via hole 106.

SUMMARY OF THE INVENTION

Accordingly, the present invention is directed to a method of forming a metal line in a semiconductor device that substantially obviates one or more problems due to limitations and disadvantages of the related art.

An object of the present invention is to provide a method of forming a metal line in a semiconductor device, which can prevent an insulating layer from ripping out of the device and a scratch from occurring when smoothing a conductive material provided to a contact or via for a metal line.

Another object of the present invention is to provide a method of forming a metal line in a semiconductor device, in which a first metal layer deposited on a insulating interlayer is not completely removed in carrying out CMP after filling a contact or via hole with a conductive material and in which a following metal line forming process is performed on the remaining first metal layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a metal line in a semiconductor device according to the present invention includes the steps of forming an insulating interlayer over a substrate provided with a lower metal line, forming a hole exposing the lower metal line, forming a first metal layer on the insulating interlayer including an inside of the hole and the lower metal line, forming a conductor layer on the first metal layer to fill the hole, etching back the conductor layer to form a plug until the first metal layer is exposed, sequentially stacking a second metal layer and a third metal layer on the first metal layer, and patterning the second metal layer, the third metal layer, and the first metal layer to form an upper metal line overlapped with the plug using an etch mask defining the upper metal line.

In an exemplary embodiment, the method further includes the step of removing the etch mask.

In an exemplary embodiment, the first and second metal layers are each formed of Ti/TiN.

In an exemplary embodiment, the metal layer is formed of aluminum.

In an exemplary embodiment, the conductor layer is formed of tungsten.

In an exemplary embodiment, the etching back step includes chemical mechanical polishing (CMP).

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, which are illustrated in the accompanying drawings. Wherever possible, the same reference numbers will be used throughout the drawings to refer to the same or like parts.

An exemplary embodiment of the present invention is characterized as follows. A first metal layer deposited on an insulating interlayer is not completely removed after carrying out CMP after filling a contact or via hole with a conductive material. A metal line forming process is performed on the remaining first metal layer.

FIGS. 2A to 2F are cross-sectional diagrams for explaining a process of forming a metal line in a semiconductor device according to an exemplary embodiment of the present invention.

Figure 1A:
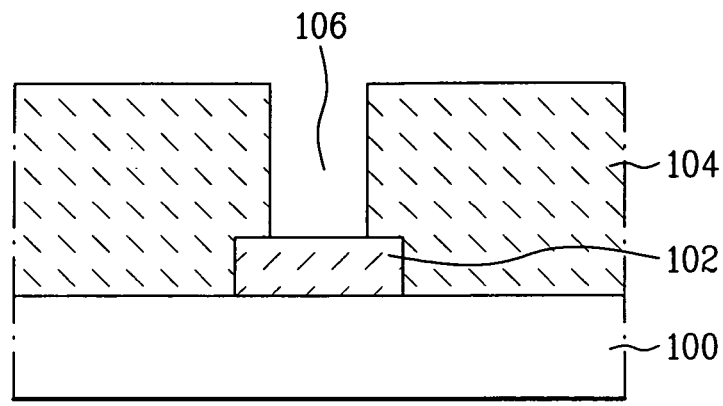
FIGS. 1A to 1F are cross-sectional diagrams for explaining a process of forming a metal line according to a related art.
Figure 1B:
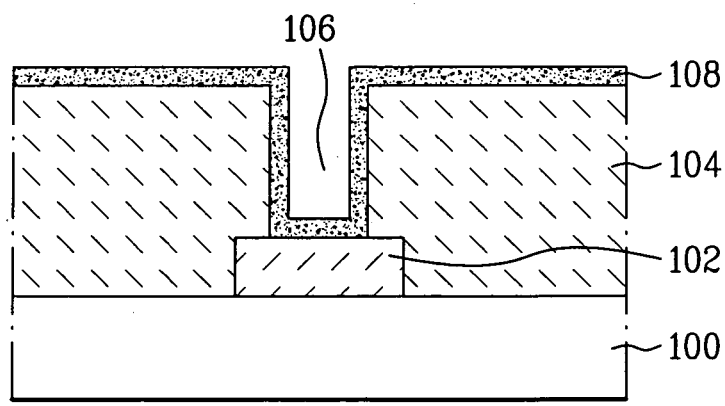
Figure 1C:
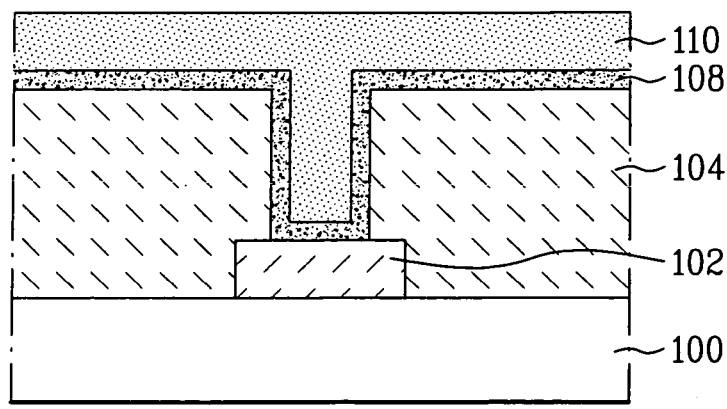
Figure 1D:
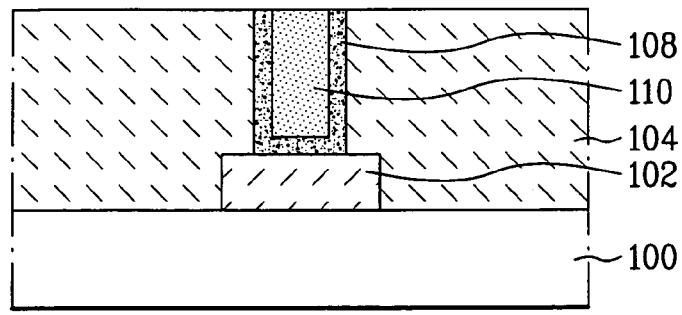
Figure 1E:
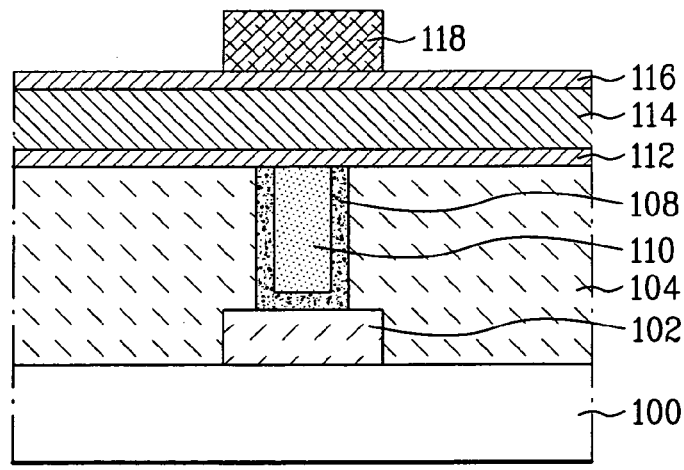
Figure 1F:
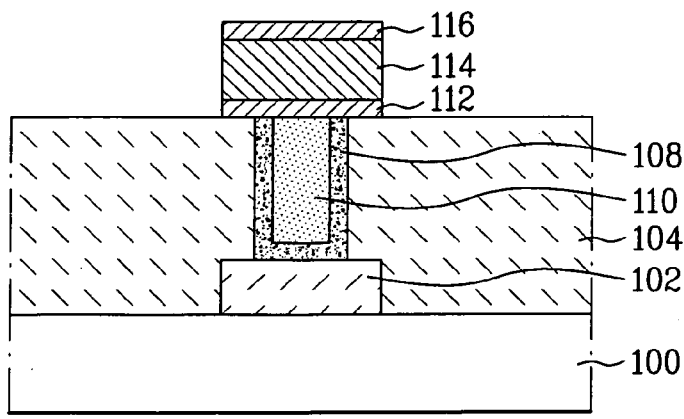
Figure 2A:
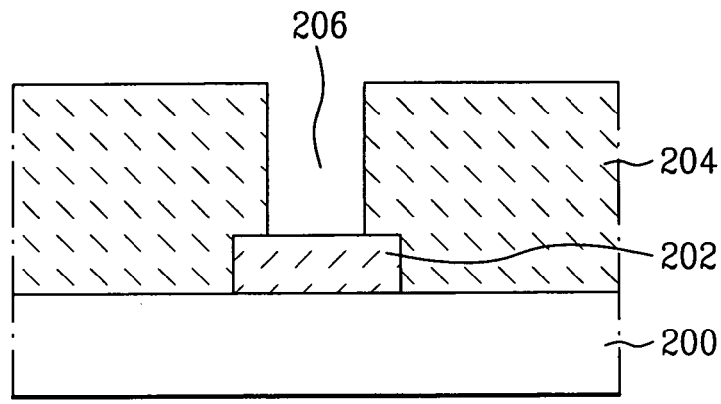
FIGS. 2A to 2F are cross-sectional diagrams for explaining a process of forming a metal line in a semiconductor device according to an exemplary embodiment of the present invention.

Referring to FIG. 2A, a metal line 202 is formed on a semiconductor substrate 200 provided with various devices therein. Subsequently, an insulating interlayer 204 is formed over the semiconductor substrate 200 including the metal line 202 and is then made smooth. A prescribed portion of the insulating interlayer 204 is selectively etched to form a contact or via hole 206 exposing part of the metal line 202.

Figure 2B:
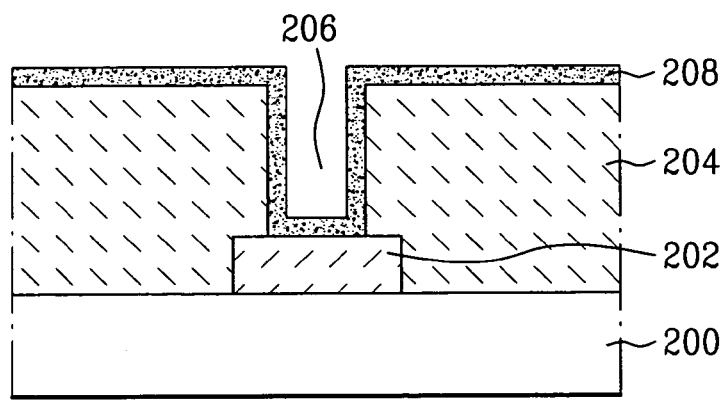

Referring to FIG. 2B, a first metal layer 208 is formed on the insulating inter layer 204 including an inside of the contact or via hole 206. In this case, the first metal layer 208 is formed of a liner barrier metal such as Ti/TiN.

Figure 2C:
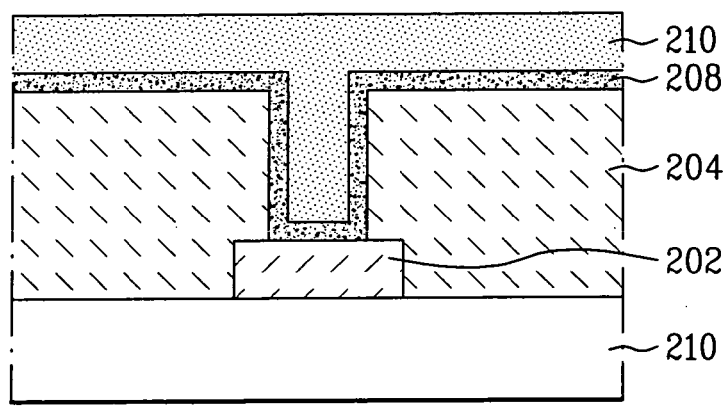

Referring to FIG. 2C, a tungsten layer 210 is deposited on the first metal layer 208 so that the contact or via hole 206 is filled up with the tungsten layer 210.

Figure 2D:
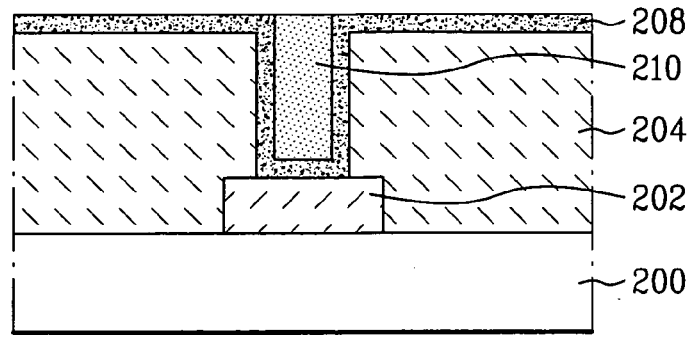

Referring to FIG. 2D, the tungsten layer 210 is etched back to form a tungsten plug 210 within the contact or via hole. Specifically, in carrying out CMP (chemical mechanical polishing) after the contact or via hole 206 has been filled up with the tungsten layer 210, the first metal layer 208 is used as a CMP-stop layer. Namely, CMP is carried out until a surface of the first metal layer 208 is exposed. Hence, the first metal layer 208 is not completely removed but remains on the insulating interlayer 204.

Figure 2E:
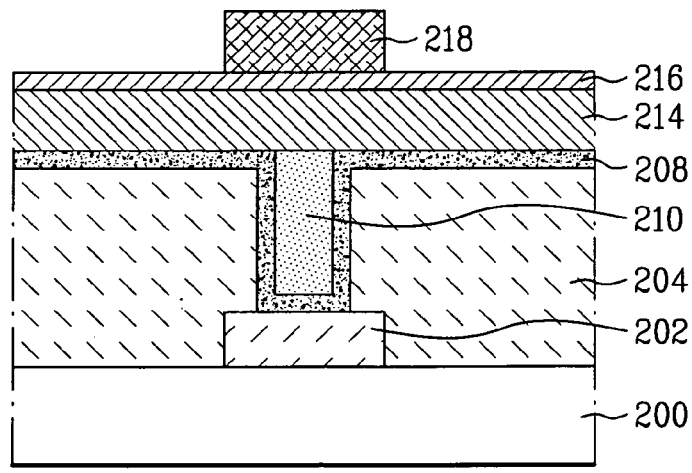

Referring to FIG. 2E, a second metal layer 214 and a third metal layer 216 are sequentially deposited over the substrate 200 including the tungsten plug 210. Photoresist is coated on the third metal layer 216. Exposure and development is carried out on the photoresist to form a photoresist pattern 218 defining a metal line over the tungsten plug 210. Specifically, the third metal layer 216 is preferably formed of Ti/TiN. And, the second metal layer 214 as a main line material may be formed of aluminum.

Figure 2F:
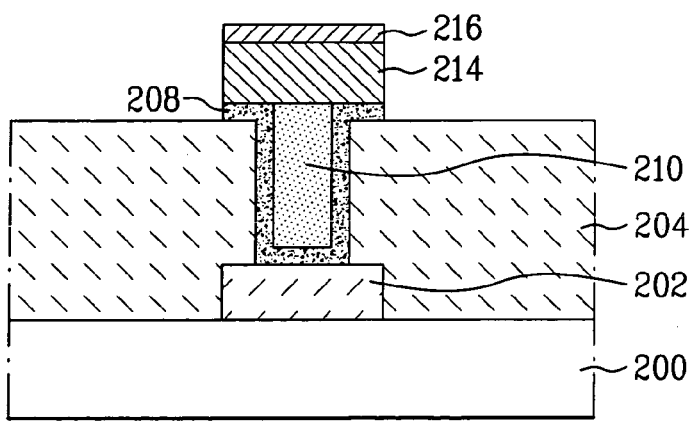

Referring to FIG. 2F, dry etch is carried out over the substrate 200 including the third metal layer 216, the second metal layer 214, and the first metal layer 208 using the photoresist pattern 218 in FIG. 2E as an etch mask. Hence, a metal line consisting of a portion of the first metal layer 208, the second metal layer 214, and the third metal layer 216 is completed, wherein the portion of the first metal layer 208 is on the insulating interlaver 204 and the second metal layer is on the portion of the first metal layer 208 and the tungsten plug 210. Finally, the photoresist pattern is removed.

Accordingly, in the present invention, the related art touch-up process can be skipped in forming the metal line of the semiconductor device, whereby an overall process can be simplified. Further, the present invention can prevent the scratches and damage caused to the insulating interlayer.

Moreover, the first metal layer is overetched in patterning the metal line on the insulating interlayer so that tungsten residues can be efficiently removed from the surface of the first metal layer.

Therefore, the present invention lowers failure in forming the metal line, thereby enhancing reliability and yield of the semiconductor devices.

Korean Patent Application No. P2003-0089431, filed on Dec. 10, 2003, is incorporated herein by reference in its entirety.

It will be apparent to those skilled in the art that various modifications and variations can be made in practicing the present invention. Thus, it is intended that the present invention covers the modifications and variations of this invention within the scope of the appended claims and their equivalents.

What is claimed is:

1. A method of forming a metal line in a semiconductor device, comprising the steps of:
   forming an insulating interlayer over a substrate provided with a lower metal line;
   forming a hole exposing the lower metal line;
   forming a first metal layer on the insulating interlayer including an inside of the hole and the lower metal line;
   forming a conductor layer on the first metal layer to fill the hole;
   etching back the conductor layer to form a plug and stopping the etching back when the first surface of metal layer is exposed;
   sequentially stacking a second metal layer and a third metal layer on the first metal layer and the plug; and
   patterning the second metal layer, the third metal layer, and the first metal layer to form an upper metal line overlapped with the plug using an etch mask defining the upper metal line.

2. The method of claim 1, further comprising the step of removing the etch mask.

3. The method of claim 1, wherein the first and third metal layers are formed of Ti or TiN.

4. The method of claim 1, wherein the second metal layer is formed of aluminum.

5. The method of claim 1, wherein the conductor layer is formed of tungsten.

6. The method of claim 1, wherein the etching back step includes chemical mechanical polishing.

* * * * *